US010643877B2

(12) United States Patent
Ogo

(10) Patent No.: US 10,643,877 B2
(45) Date of Patent: May 5, 2020

(54) RETRIEVING DEVICE AND STORING DEVICE

(71) Applicant: Murata Machinery, Ltd., Kyoto-shi, Kyoto (JP)

(72) Inventor: Haruki Ogo, Inuyama (JP)

(73) Assignee: Murata Machinery, Ltd., Kyoto-shi, Kyoto (JP)

( * ) Notice: Subject to any disclaimer, the term of this patent is extended or adjusted under 35 U.S.C. 154(b) by 0 days.

(21) Appl. No.: 15/752,872

(22) PCT Filed: Jul. 19, 2016

(86) PCT No.: PCT/JP2016/071139
§ 371 (c)(1),
(2) Date: Feb. 14, 2018

(87) PCT Pub. No.: WO2017/033621
PCT Pub. Date: Mar. 2, 2017

(65) Prior Publication Data
US 2018/0233391 A1    Aug. 16, 2018

(30) Foreign Application Priority Data

Aug. 27, 2015   (JP) .................................. 2015-167627

(51) Int. Cl.
*H01L 21/677* (2006.01)
*H01L 21/687* (2006.01)
*B65G 1/04* (2006.01)

(52) U.S. Cl.
CPC .......... *H01L 21/67706* (2013.01); *B65G 1/04* (2013.01); *H01L 21/6773* (2013.01); *H01L 21/67733* (2013.01); *H01L 21/67736* (2013.01); *H01L 21/67766* (2013.01); *H01L 21/67769* (2013.01); *H01L 21/68707* (2013.01); *B65G 1/0435* (2013.01)

(58) Field of Classification Search
CPC ........ B65G 1/04; B65G 1/0435; B65G 61/00; B65G 1/0457; H01L 21/6773; H01L 21/67766; H01L 21/67769; B25J 1/04; B25J 1/06; B25J 15/08
USPC .......................................... 294/67.3, 29, 32
See application file for complete search history.

(56) References Cited

U.S. PATENT DOCUMENTS

| 4,000,923 A | * | 1/1977 | Baldwin | ................... B66C 1/26 |
| | | | | 294/67.22 |
| 4,911,608 A | * | 3/1990 | Krappitz | ................ B25J 13/086 |
| | | | | 294/87.1 |

(Continued)

FOREIGN PATENT DOCUMENTS

| JP | S62-152446 | 9/1987 |
| JP | S63-165850 | 10/1988 |

(Continued)

*Primary Examiner* — Kaitlin S Joerger
(74) *Attorney, Agent, or Firm* — Procopio, Cory, Hargreaves & Savitch LLP

(57) ABSTRACT

A retrieving device 1 includes: a supporting unit 13 configured to support a front portion of the load 120 from a front side of the load 120; a coupling unit 9, 11 configured to be coupled, via a coupling member 142, to a moving device 140 being capable of moving the supporting unit 13 in an up-and-down direction; and a gripping unit 15, 17 provided on a side opposite to the supporting unit 13 with the coupling unit 9, 11 interposed therebetween.

6 Claims, 9 Drawing Sheets

(56) References Cited

U.S. PATENT DOCUMENTS

| | | | | |
|---|---|---|---|---|
| 5,102,292 A * | 4/1992 | Brinker | ............... | B65G 61/00 |
| | | | | 414/796 |
| 5,605,432 A * | 2/1997 | Fink | ............... | B25J 15/04 |
| | | | | 414/752.1 |
| 6,082,797 A * | 7/2000 | Antonette | ............... | B25J 9/104 |
| | | | | 294/103.1 |
| 6,238,173 B1 * | 5/2001 | Corsini | ............... | B65G 47/086 |
| | | | | 414/788.1 |
| 7,967,354 B2 * | 6/2011 | Faulkner | ............... | B25J 9/0093 |
| | | | | 294/103.1 |
| 8,087,869 B1 * | 1/2012 | Binford | ............... | B65G 59/005 |
| | | | | 414/789.5 |
| 8,235,436 B2 * | 8/2012 | Ryf | ............... | B65G 47/90 |
| | | | | 294/103.1 |
| 9,061,868 B1 * | 6/2015 | Paulsen | ............... | B66C 1/0218 |
| 9,576,832 B2 * | 2/2017 | Tomida | ............... | H01L 21/6773 |
| 9,617,075 B2 * | 4/2017 | Porat | ............... | B65G 1/137 |
| 9,640,417 B2 * | 5/2017 | Yuk | ............... | H01L 21/67379 |
| 10,023,385 B2 * | 7/2018 | Shibata | ............... | H01L 21/67769 |
| 2003/0123962 A1 * | 7/2003 | Mikulic | ............... | B65G 59/023 |
| | | | | 414/403 |
| 2008/0251415 A1 | 10/2008 | Yamagishi et al. | | |
| 2016/0137435 A1 * | 5/2016 | Tanaka | ............... | B65G 37/00 |
| | | | | 414/564 |
| 2018/0047591 A1 * | 2/2018 | Ogo | ............... | B65G 1/04 |
| 2018/0076059 A1 * | 3/2018 | Abe | ............... | H01L 21/6773 |
| 2019/0031440 A1 * | 1/2019 | Ito | ............... | B65G 1/0407 |

FOREIGN PATENT DOCUMENTS

| | | |
|---|---|---|
| JP | 2584998 | 9/1998 |
| JP | 2011001149 A | 1/2011 |
| JP | 4842879 | 10/2011 |

\* cited by examiner

Fig.8
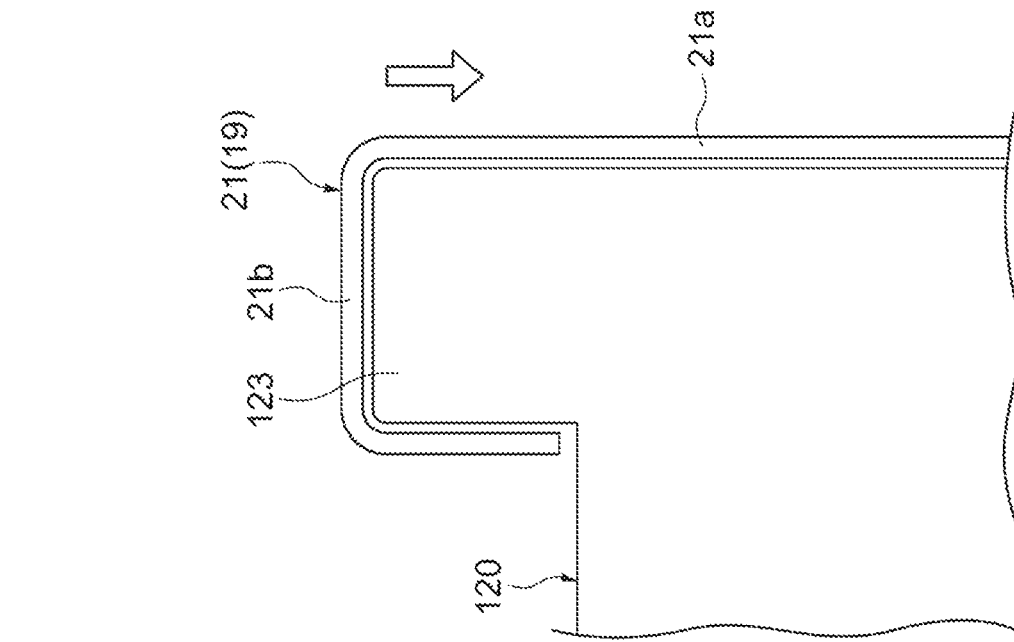
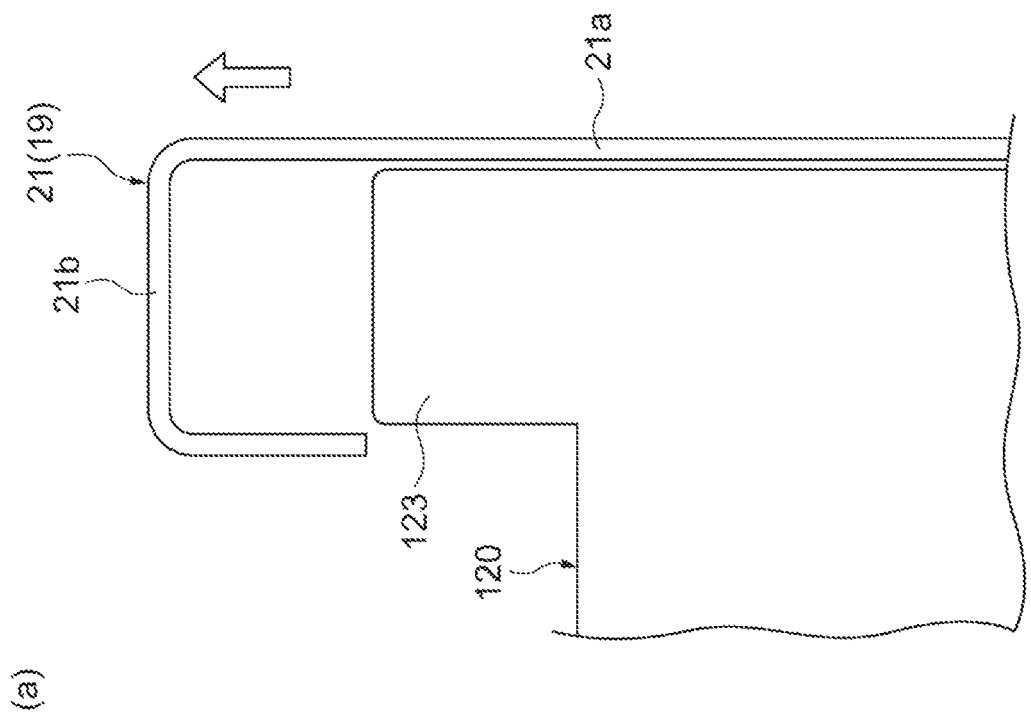

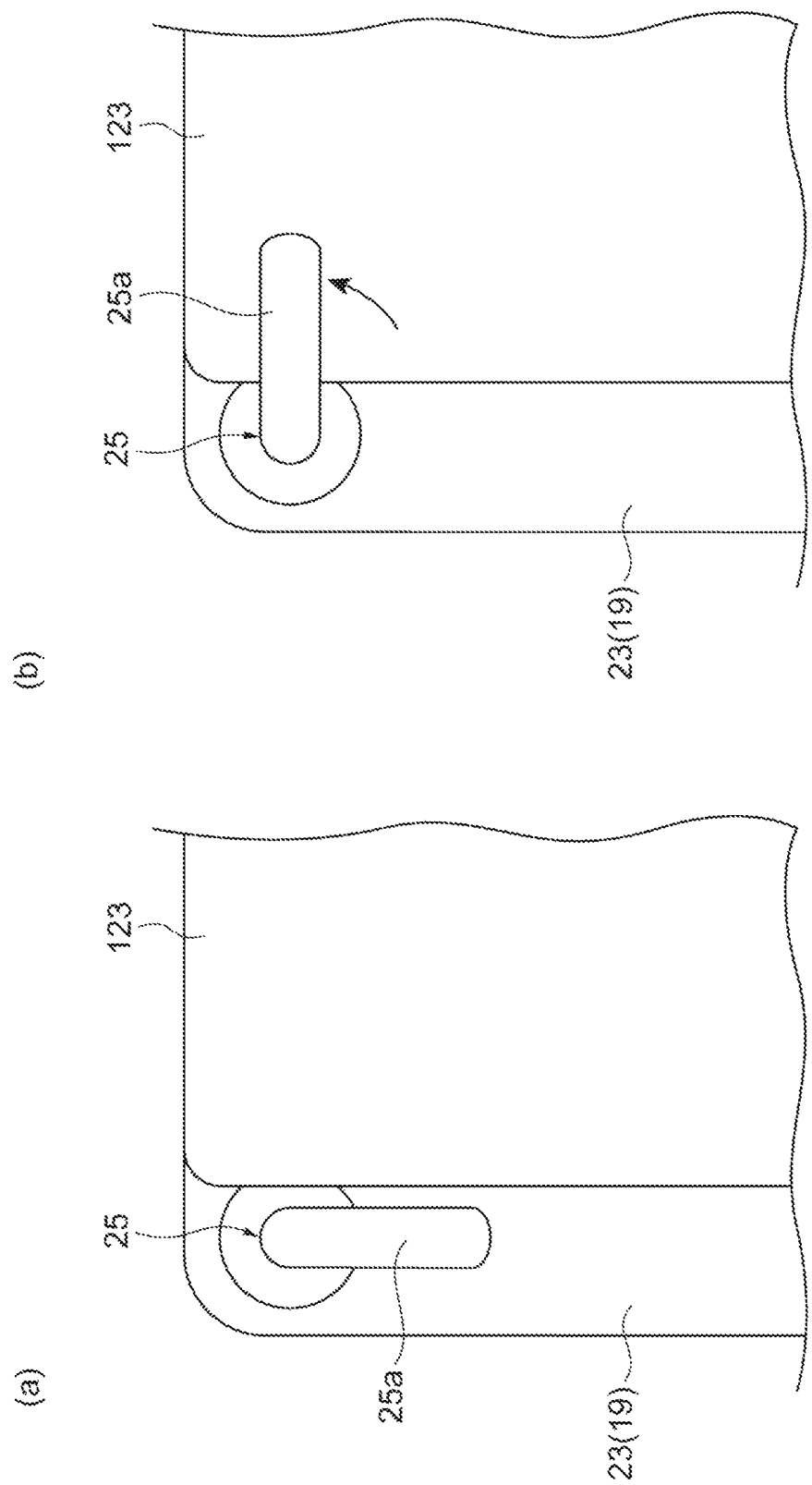

RETRIEVING DEVICE AND STORING DEVICE

CROSS-REFERENCE TO RELATED APPLICATIONS

This application is a U.S. National Stage entry of PCT Application No: PCT/JP2016/071139 filed Jul. 19, 2016, which claims priority to Japanese Patent Application No. 2015-167627, filed Aug. 27, 2015, the contents of which are incorporated herein by reference.

TECHNICAL FIELD

The example implementation(s) relates to a retrieving device and a storing device.

RELATED ART

Examples of a related art semiconductor conveyance cassette configured to accommodate semiconductor wafers include a front-opening unified pod (FOUP). In a storing device configured to store FOUPs, transfer of a FOUP between a port where loading and unloading are performed and shelves is performed by a transfer device. In the storing device including the transfer device, if the transfer device becomes incapable of operating due to a failure, for example, the transfer of a FOUP is performed by hand. However, in recent years, the diameters of semiconductor wafers have increased, and the sizes of FOUPs have accordingly increased (the weights thereof have increased), which makes it difficult to handle such a FOUP by hand.

In view of this related art, a storing device described in Patent Document 1, for example, includes a manual conveying device that can be manually operated, in addition to a transfer device. This manual conveying device includes a gripping unit being capable of gripping a flange of a FOUP, a belt coupled to the gripping unit, a hoisting unit configured to wind up the belt, and a sliding unit provided so as to be capable of sliding on a ceiling in the storing device, and that can manually convey a FOUP when the transfer device cannot be used.

CITATION LIST

Patent Literature

[Patent Document 1] Japanese Unexamined Patent Publication No. 2011-1149

SUMMARY OF INVENTION

Technical Problem

In the related art manual conveying device of the storing device described above, the gripping unit is required to be attached to a flange of a FOUP. However, it is not easy to insert the gripping unit into a small clearance between the FOUP and a shelf to perform work. Thus, for manual conveyance of a semiconductor conveyance cassette such as a FOUP, further improvement of workability is required.

It is an object of one aspect of the example implementation(s) to provide a retrieving device and a storing device that can improve workability.

Solution to Problem

A retrieving device of one aspect of the example implementation(s) is a retrieving device provided in a storing device including a shelf on which or from which a load is loaded or unloaded through an opening that is open forward, and configured to retrieve the load from the shelf through the opening. The retrieving device includes: a supporting unit configured to support a front portion of the load from a front side of the load; a coupling unit configured to be coupled, via a coupling member, to a moving device being capable of moving the supporting unit in an up-and-down direction; and a gripping unit provided on a side opposite to the supporting unit with the coupling unit interposed therebetween.

The retrieving device of this aspect of the example implementation(s) includes the supporting unit configured to support the front portion of the load from the front side of the load. Thus, even if the clearance between the load and the shelf is small, the front portion of the load is supported, whereby the load can be supported without working in this small clearance. The supporting unit can be moved in the up-and-down direction by the moving device coupled to the coupling unit via the coupling member. Thus, the supporting unit is moved upward by the moving device with the load being supported by the supporting unit, whereby the load can be lifted from the shelf. This enables the retrieving device to easily retrieve the load from the shelf, which improves workability. When the load is retrieved from the shelf, the supporting unit is suspended by the moving device via the coupling unit. At this time, the retrieving device tilts toward the load due to the weight of the load.

To prevent the foregoing, in the retrieving device, the gripping unit is provided on the side opposite to the supporting unit with the coupling unit interposed therebetween. With this configuration, force acting against the tilting of the supporting unit due to the weight of the load can be easily applied by the gripping unit, which allows the retrieving device to be easily balanced. This enables the retrieving device to be stably operated, which improves workability.

In one implementation, the supporting unit may include a first supporting unit configured to support a bottom surface of the load and a second supporting unit configured to restrict movement of the load supported by the first supporting unit. With this configuration, the load can be stably supported by the first supporting unit. Furthermore, the load can be prevented by the second supporting unit from being displaced. Thus, the load can be stably retrieved.

In one implementation, the second supporting unit may be provided above the first supporting unit to restrict movement of the load in the up-and-down direction. With this configuration, the load the bottom surface of the front portion of which is supported by the first supporting unit can be prevented from tilting rearward. Thus, the load can be stably retrieved.

In one implementation, the retrieving device may include an attachment unit provided on a side of the gripping unit and configured to detachably support a weight member. With this configuration, by attaching the weight member to the attachment unit in accordance with the weight of the load, balance can be adjusted based on the weight of the load. This enables the load to be more stably retrieved.

In one implementation, the gripping unit may include a first gripping unit disposed above the supporting unit and a second gripping unit disposed below the supporting unit. With this configuration, the first gripping unit and the second gripping unit at two locations can be gripped and operated, and thus the load can be more stably retrieved.

A storing device according to one aspect of the example implementation(s) is a storing device including: a housing; a plurality of shelves that are provided in the housing and on each of which or from each of which a load is loaded or unloaded through an opening that is open forward; a port where loading and unloading are performed; a transfer device configured to transfer the load between the port and the shelves; and a retrieving device configured to retrieve the load forward from the shelves through the opening.

The retrieving device includes: a supporting unit configured to support a front portion of the load from a front side of the load; a coupling unit configured to be coupled, via a coupling member, to a moving device being capable of moving the supporting unit in an up-and-down direction; and a gripping unit provided on a side opposite to the supporting unit with the coupling unit interposed therebetween.

The storing device according to this aspect of the example implementation(s) includes the retrieving device. The retrieving device includes the supporting unit configured to support a front portion of a load from the front side of the load. Thus, even if the clearance between the load and the corresponding shelf is small, the front portion of the load is supported, whereby the load can be supported without working in this small clearance. The supporting unit can be moved in the up-and-down direction by the moving device coupled to the coupling unit via the coupling member. Thus, the supporting unit is moved upward by the moving device with the load being supported by the supporting unit, whereby the load can be lifted from the shelf. Consequently, in the storing device, the load can be easily retrieved from the shelf by the retrieving device even if the transfer device does not operate.

When the load is retrieved from the shelf, the supporting unit is suspended by the moving device via the coupling unit. At this time, the retrieving device tilts toward the load due to the weight of the load. To prevent the foregoing, in the retrieving device, the gripping unit is provided on the side opposite to the supporting unit with the coupling unit interposed therebetween. With this configuration, force acting against the tilting of the supporting unit due to the weight of the load can be easily applied by the gripping unit, which allows the retrieving device to be easily balanced. This enables the retrieving device to be stably operated, which improves workability.

Advantageous Effects of Invention

According to one aspect of the example implementation(s), workability can be improved.

BRIEF DESCRIPTION OF DRAWINGS

FIG. 8(*a*) is a diagram illustrating a state in which a hook portion is not yet engaged with a front flange, and FIG. 8(*b*) is a diagram illustrating a state in which the hook portion has been engaged with the front flange.

FIG. 9(*a*) is a diagram illustrating a state in which a hook part is not yet engaged with a front flange, and FIG. 9(*b*) is a diagram illustrating a state in which the hook part has been engaged with the front flange.

DESCRIPTION OF IMPLEMENTATIONS

A preferred implementation of the example implementation(s) will now be described in detail with reference to the attached drawings. In the description of the drawings, like or equivalent elements are designated by like reference signs, and duplicated explanation is omitted.

[Conveyance System]

Figure 1:
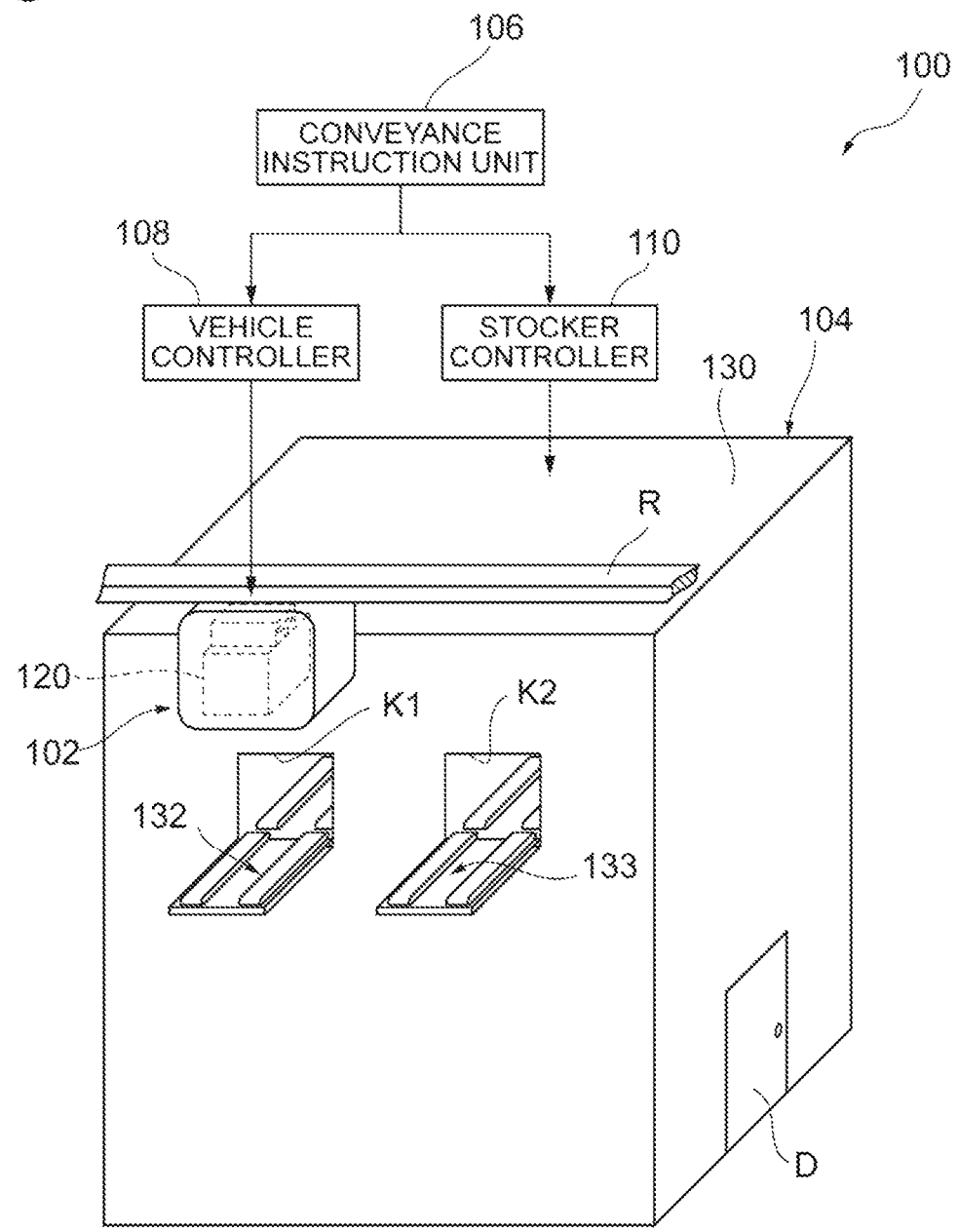
FIG. 1 is a perspective view illustrating an appearance of a conveyance system including a storing device according to one implementation.
Figure 2:
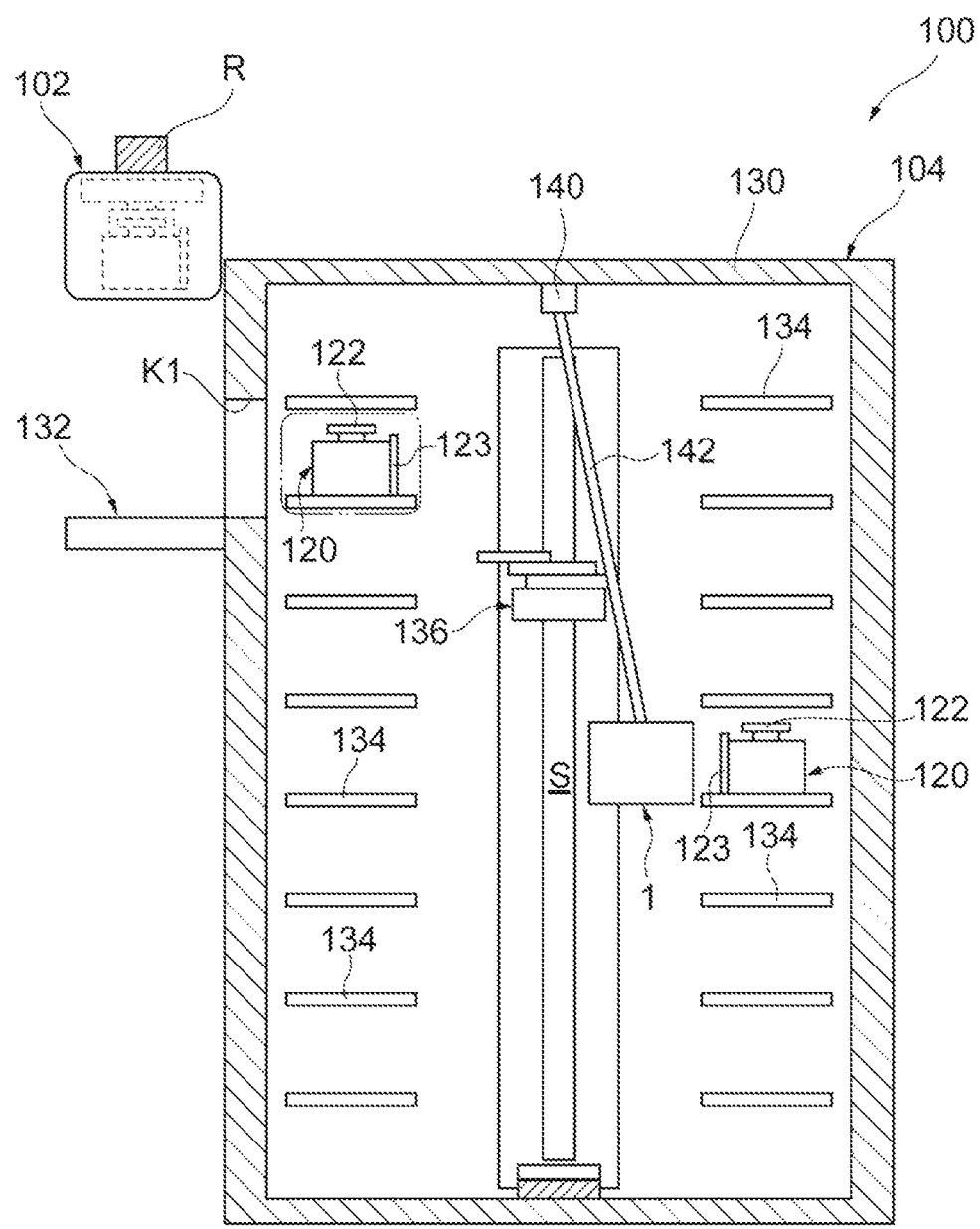
FIG. 2 is a sectional view schematically illustrating an internal structure of the storing device illustrated in FIG. 1.

As depicted in FIG. 1 and FIG. 2, a conveyance system 100 includes a vehicle 102, a stocker 104, and a rail R along which the vehicle 102 travels. The conveyance system 100 includes a conveyance instruction unit 106, a vehicle controller 108, and a stocker controller 110 as a control system. The conveyance system 100 conveys front-opening unified pods (FOUPs) 120 to or from various manufacturing devices and a stocker 104 in accordance with a conveyance schedule in semiconductor device manufacturing, and accommodates or stores the FOUPs 120 in the stocker 104.

Each FOUP 120 is a load to be accommodated and stored in the stocker 104, and is a cassette configured to accommodate a plurality of semiconductor wafers. The FOUP 120 is conveyed by the vehicle 102 along the rail R, and is also conveyed in the stocker 104 for loading and unloading or adjustment of stored positions. The FOUP 120 includes: a FOUP body having an opening formed on its front side and having an upper flange 122 configured to be gripped (held) by the vehicle 102 on its upper surface; and a lid portion (not depicted) configured to cover the opening of the FOUP body.

On the front side of the FOUP body of the FOUP 120, a front flange 123 is formed. The front flange 123 is a portion protruding outward from a periphery of the FOUP body corresponding to a position to which the lid portion is attached. Each FOUP 120 accommodates semiconductor wafers having a diameter of 300 millimeters, or 450 millimeters, for example. When semiconductor wafers are loaded in or unloaded from the FOUP 120, the lid portion is opened. At other times, the lid portion is closed so that the inside of the FOUP can be kept airtight.

The vehicle 102 is an overhead hoist transport (OHT) that is an overhead traveling vehicle using a linear motor as a power source. The vehicle 102 travels along the rail R. The vehicle 102 is configured to convey a FOUP 120 and also stop at predetermined positions on the rail R so as to be able to transfer the FOUP 120 to or from ports 132 and 133 provided to each of various manufacturing devices and the stocker 104, for example. The vehicle 102 includes a hoist, a belt, and a gripper (not depicted). The respective units of the vehicle 102 are controlled by the vehicle controller 108.

The stocker 104 is a storing device being capable of storing a plurality of FOUPs 120 that are conveyed thereto by the vehicle 102. The stocker 104 includes a body portion (housing) 130, a plurality of (herein, two) ports 132 and 133, a plurality of shelves 134, an automatic conveying device (transfer device) 136, and a retrieving device 1 (see FIG. 4).

A plurality of (herein, two) openings K1 and K2 are formed on the body portion 130. The openings K1 and K2 are formed in one side surface of the body portion 130. At the openings K1 and K2, the ports 132 and 133 are arranged, respectively. One side surface of the body portion 130 is provided with a door D through which an operator comes in and goes out.

The ports 132 and 133 are provided extending across the inside and outside of the body portion 130 through the openings K1 and K2, respectively. The ports 132 and 133 are each configured to be able to transfer a FOUP 120 between the vehicle 102 and the stocker 104. The ports 132 and 133 each include a sliding mechanism that can move a FOUP 120.

Figure 3:
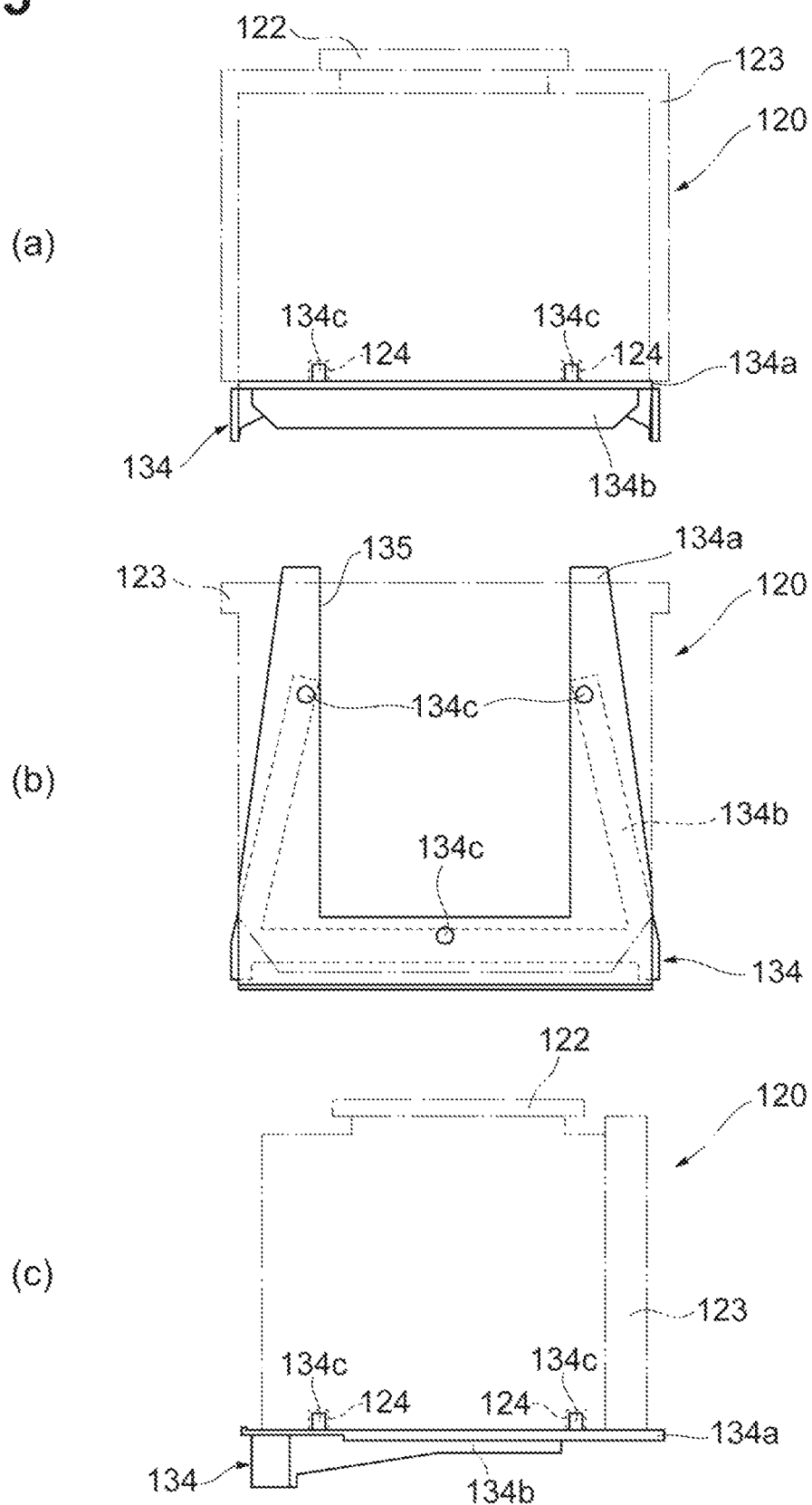
FIGS. 3(*a*)-3(*c*) are a diagram illustrating a placement unit and a fixed unit of a shelf.

As depicted in FIG. 2, a plurality (herein, eight stages) of the shelves 134 are provided in the up-and-down direction in the inside of the body portion 130. The shelves 134 are disposed in a manner opposed to each other. Between the opposed shelves 134, a space S is formed. As depicted in FIG. 3, each shelf 134 includes a placement unit 134a on which a FOUP 120 is placed and a fixed unit 134b supporting and fixing the placement unit 134a.

The placement unit 134a is a plate-like member, and has a substantially U-shape when viewed from above. In the placement unit 134a, an opening 135 that is open in a forward direction is formed. In other words, the placement unit 134a is brought into contact with both end portions of a FOUP 120 in the width direction and a rear end portion thereof. The placement unit 134a is provided with a plurality of (herein, three) positioning pins 134c. The positioning pins 134c each have a cylindrical shape, protruding from the upper surface (placement surface) of the placement unit 134a. When a FOUP 120 is placed on the placement unit 134a, the positioning pins 134c are inserted into positioning holes 124 formed in a bottom portion of the FOUP 120. The positioning pins 134c position the FOUP 120, and also restrict movement of the FOUP 120 in the front-and-rear direction and the left-and-right direction.

The fixed unit 134b has a substantially U-shape when viewed from above, and is provided under the placement unit 134a. The fixed unit 134b is fixed by bolts, for example, on a frame (not depicted) disposed in the body portion 130.

Spacing between the shelves 134 in the up-and-down direction only needs to be an amount sufficient to prevent contact with the upper shelf 134 when the positioning pins 134c are disengaged with the positioning holes 124 of the FOUP 120 (e.g., when the FOUP 120 is lifted above the upper end surfaces of the positioning pins 134c). In other words, the spacing between the shelves 134 only needs to be a dimension substantially equal to the sum of the height of the FOUP 120 and the height of the positioning pin 134c. By this configuration, efficiency of storing FOUPs 120 in the stocker 104 can be increased.

Referring back to FIG. 1 and FIG. 2, the automatic conveying device 136 is a stacker crane that, controlled by the stocker controller 110, can automatically convey a FOUP 120 between a plurality of shelves 134, and between the ports 132 and 133 and the shelves 134. The automatic conveying device 136 is provided so as to be movable in the space S in the body portion 130.

The conveyance instruction unit 106 is a material control system (MCS). The conveyance instruction unit 106 is configured to prepare a conveyance schedule based on a semiconductor-device manufacturing schedule of a manufacturing instruction unit (not depicted) that is a main controller, and be able to control the vehicle controller 108 and the stocker controller 110 in accordance with this conveyance schedule. The conveyance instruction unit 106 instructs the vehicle controller 108 to cause the vehicle 102 to convey a FOUP 120, and also instructs the stocker controller 110 to cause a FOUP 120 to be conveyed in the stocker 104.

The vehicle controller 108 is configured to control the vehicle 102 to convey the FOUP 120 along the rail R, and also to be able to transfer the FOUP 120 between various manufacturing devices and the stocker 104, for example, based on the instruction of the conveyance instruction unit 106.

The stocker controller 110 is configured to control the ports 132 and 133 and the respective units of the automatic conveying device 136 to transfer (load or unload) the FOUP 120 to or from the vehicle 102 through the ports 132 and 133, and also to control the automatic conveying device 136 to be able to perform conveyance (e.g., intra-storing device conveyance) of the FOUP 120 in the stocker 104 on the basis of the instruction of the conveyance instruction unit 106.

[Retrieving Device]

Figure 4:
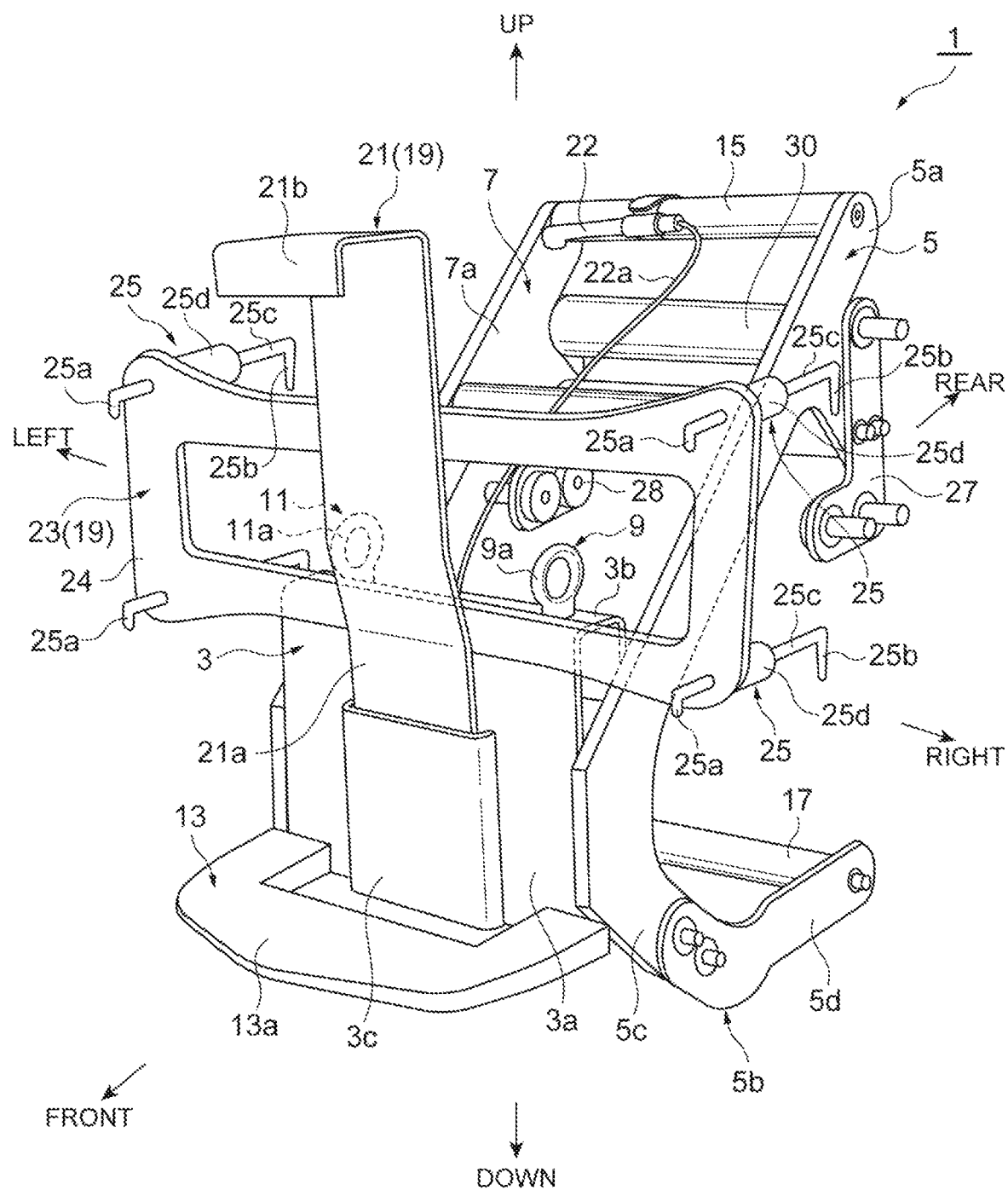
FIG. 4 is a perspective view illustrating a retrieving device according to one implementation.
Figure 5:
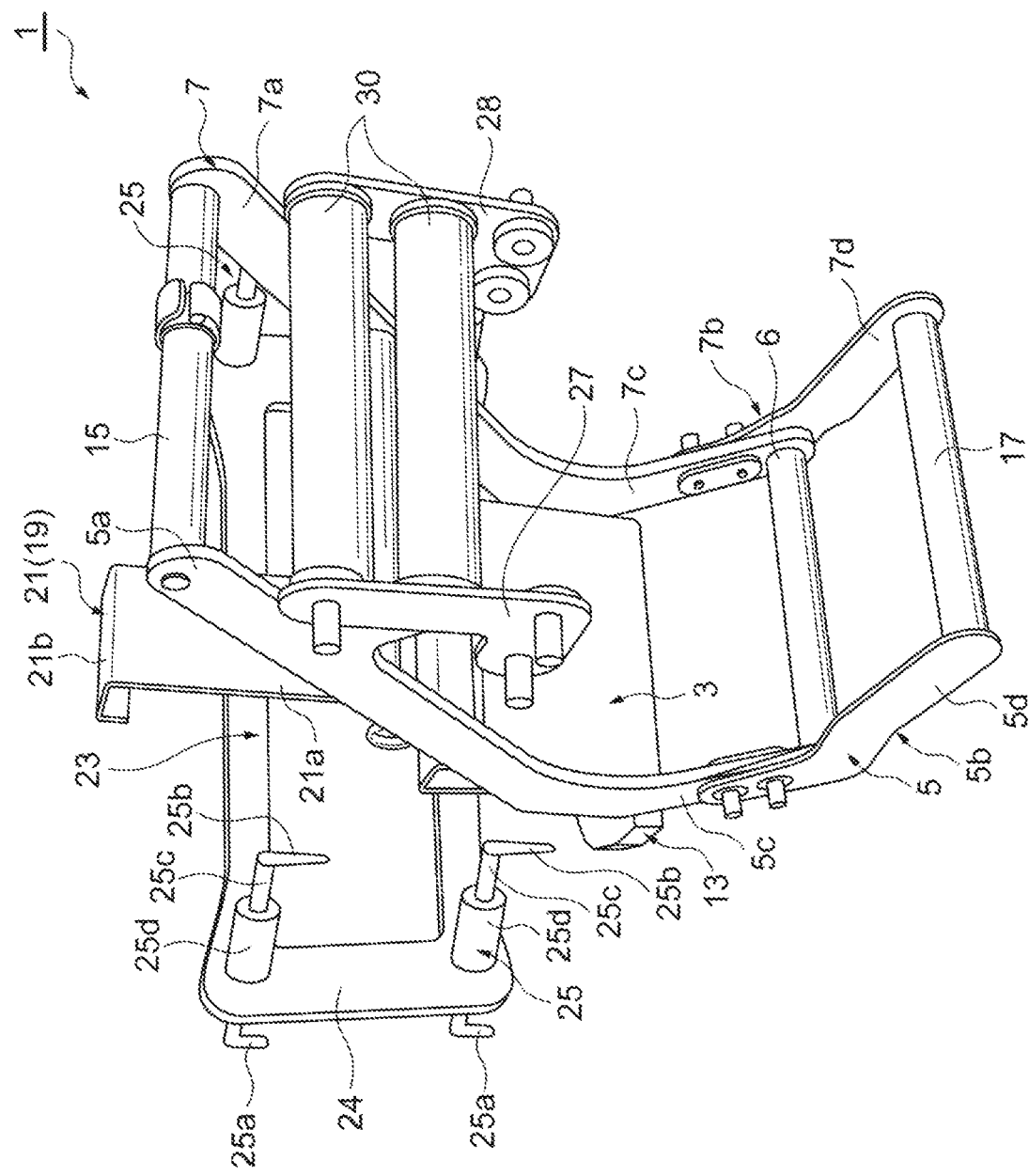
FIG. 5 is a perspective view illustrating the retrieving device according to one implementation.

The following describes the retrieving device 1 used in the stocker 104 having the configuration described above. The retrieving device 1 is a device configured to manually retrieve a FOUP 120 from a shelf 134 in the stocker 104. The retrieving device 1 is configured to be able to retrieve the FOUP 120 to the space S (see FIG. 2) in front of the shelf 134, for example, when the automatic conveying device 136 cannot be used. In FIG. 4, the front-and-rear direction, the left-and-right direction, and the up-and-down direction are each set. The left-and-right direction is also called the width direction, and the up-and-down direction is also called the height direction.

As depicted in any of FIG. 4 to FIG. 7, the retrieving device 1 includes a main frame 3, a first sub-frame 5 and a second sub-frame 7, coupling units 9 and 11, a supporting unit (first supporting unit) 13, a first handle (first gripping unit) 15 and a second handle (second gripping unit) 17, a locking unit (second supporting unit, supporting unit) 19, and a first attachment unit 27 and a second attachment unit 28. The main frame 3, the first sub-frame 5 and the second sub-frame 7, the coupling units 9 and 11, the supporting unit 13, the first handle 15 and the second handle 17, the locking unit 19, and the first attachment unit 27 and the second attachment unit 28 are each formed of metal such as stainless steel.

The main frame 3 is formed by bending a plate-like member, for example. A front surface 3a of the main frame 3 has a substantially rectangular shape. An upper portion 3b of the main frame 3 is bent rearward. The upper portion 3b has a substantially L-shaped cross-section. The upper surface of the upper portion 3b is flat.

The first sub-frame 5 and the second sub-frame 7 are provided to both end portions of the main frame 3 in the width direction (left-and-right direction). The first sub-frame 5 and the second sub-frame 7 have the same configuration. Hereinafter, the first sub-frame 5 will be specifically described as one example.

The first sub-frame 5 includes a first frame 5a and a second frame 5b. The first frame 5a extends obliquely upward and rearward with respect to the front surface 3a of the main frame 3. A rear end portion of the first frame 5a is positioned above the supporting unit 13.

The second frame 5b includes a first part 5c and a second part 5d. The first part 5c extends obliquely downward and rearward with respect to the front surface 3a of the main frame 3. The angle formed by the extending direction of the first part 5c with respect to the front surface 3a is similar to the angle formed by the first frame 5a with respect to the front surface 3a, for example. The first part 5c of the second frame 5b is formed integrally with the first frame 5a. In other words, the first frame 5a and the first part 5c form a substantially V-shape.

The second part 5d is coupled to one end portion of the first part 5c, and extends rearward farther than the first part 5c. The second part 5d extends in a direction intersecting the extending direction of the first part 5c. Specifically, the second part 5d extends in a direction (e.g., front-and-rear direction) substantially orthogonal to the front surface 3a of the main frame 3. A rear end portion of the second part 5d is positioned below the supporting unit 13. The rear end portion of the first frame 5a and the rear end portion of the second part 5d of the second frame 5b are arranged in the same position in the height direction (e.g., up-and-down direction). The first part 5c and the second part 5d may be integrally formed.

The second sub-frame 7 includes a first frame 7a and a second frame 7b. The second frame 7b includes a first part 7c and a second part 7d.

Between the first sub-frame 5 and the second sub-frame 7, a reinforcing member 6 is provided. The reinforcing member 6 is a member that is provided to increase rigidity of the first sub-frame 5 and the second sub-frame 7. The reinforcing member 6 is a member having a cylindrical shape, for example. The reinforcing member 6 is bridged between the first sub-frame 5 and the second sub-frame 7. In the present implementation, the reinforcing member 6 is provided in two pieces.

The reinforcing members 6 are only required to be disposed appropriately on portions other than positions where the first handle 15 and the second handle 17 described later are attached. The number of the reinforcing members 6 to be provided is only required to be set appropriately depending on the design, or the reinforcing members may be omitted.

The coupling units 9 and 11 are coupled to hooks (not depicted) provided to chains (coupling members) 142 of a chain block (moving device) 140 described later. The coupling units 9 and 11 are fixed to the upper portion 3b of the main frame 3. The coupling units 9 and 11 are fixed to the upper portion 3b of the main frame 3 by welding or bolt fastening, for example. The coupling units 9 and 11 are disposed in a pair on the upper portion 3b of the main frame 3 with a predetermined distance spaced from each other along the width direction of the main frame 3. The coupling units 9 and 11 have annular coupling parts 9a and 11a, respectively. On the coupling parts 9a and 11a, the hooks of the chains 142 are hooked.

The supporting unit 13 is a plate-like member, which supports the bottom surface of a FOUP 120. The supporting unit 13 is provided on the front side of the main frame 3. The supporting unit 13 is positioned at a lower portion of the main frame 3, and protrudes forward from the front surface 3a of the main frame 3. The supporting surface 13a (upper surface) of the supporting unit 13 is flat. The supporting surface 13a extends in a direction substantially orthogonal to the front surface 3a of the main frame 3. The length dimension (dimension protruding forward from the front surface 3a of the main frame 3) of the supporting unit 13 is set so that a front portion of a FOUP 120 can be supported.

The front portion of a FOUP 120 is a portion of the FOUP 120 anterior to a central portion thereof. The width dimension of the supporting unit 13 is set to such a dimension that the supporting unit can be inserted into the opening 135 of the placement unit 134a. In other words, the width dimension of the supporting unit 13 is set equal to or smaller than a spacing between a pair of portions of the placement unit 134a opposed to each other (see FIG. 3).

The first handle 15 and the second handle 17 are attached to the first sub-frame 5 and the second sub-frame 7. The first handle 15 and the second handle 17 are gripped by an operator. The first handle 15 and the second handle 17 are each a cylindrical member. The first handle 15 is disposed on rear end portions of the first frames 5a and 7a of the first sub-frame 5 and the second sub-frame 7. Specifically, the first handle 15 is bridged between the first frame 5a of the first sub-frame 5 and the first frame 7a of the second sub-frame 7. Thus, the first handle 15 extends along the width direction. The first handle 15 is provided on the side opposite to the supporting unit 13 and above the supporting unit 13 with the coupling units 9 and 11 fixed to the main frame 3 interposed therebetween.

The second handle 17 is disposed on rear end portions of the second parts 5d and 7d in the second frames 5b and 7b of the first sub-frame 5 and the second sub-frame 7. Specifically, the second handle 17 is bridged between the second part 5d in the second frame 5b of the first sub-frame 5 and the second part 5d in the second frame 7b of the second sub-frame 7. Thus, the second handle 17 extends along the width direction. The second handle 17 is provided on the side opposite to the supporting unit 13 and below the supporting unit 13 with the coupling units 9 and 11 fixed to the main frame 3 interposed therebetween. The first handle 15 and the second handle 17 are disposed at opposite positions in the height direction.

The locking unit 19 includes a first locking unit 21 and a second locking unit 23. The first locking unit 21 restricts movement of a FOUP 120 supported by the supporting unit 13 in the up-and-down direction. The first locking unit 21 is disposed on the front surface 3a side of the main frame 3. The first locking unit 21 is formed by bending a plate-like member, for example. The first locking unit 21 has a body portion 21a extending in the height direction and a hook portion 21b formed on an upper portion of the body portion 21a. The body portion 21a and the hook portion 21b are integrally formed.

The body portion 21a is provided so as to be movable in the height direction with respect to the main frame 3. A lower end portion of the body portion 21a is accommodated by an accommodating portion 3c disposed on the front surface 3a of the main frame 3. The body portion 21a is thus accommodated by the accommodating portion 3c, thereby being held by the main frame 3. The body portion 21a is accommodated so as to be movable in the height direction in the accommodating portion 3c. The body portion 21a is moved in the height direction by operation of a lever 22 disposed at the first handle 15. Specifically, the body portion 21a is biased downward by an elastic member (not depicted).

The body portion 21a and the lever 22 are connected by a wire 22a. When the lever 22 is operated, the body portion 21a is pulled upward by the wire 22a. Thus, the body portion 21a is moved upward. When the operation of the lever 22 is released, the body portion 21a is moved downward by biasing force of the elastic member. The initial position of the body portion 21a is a position thereof when the lever 22 is not operated, that is, when the body portion is in its lowermost position.

Figure 6:
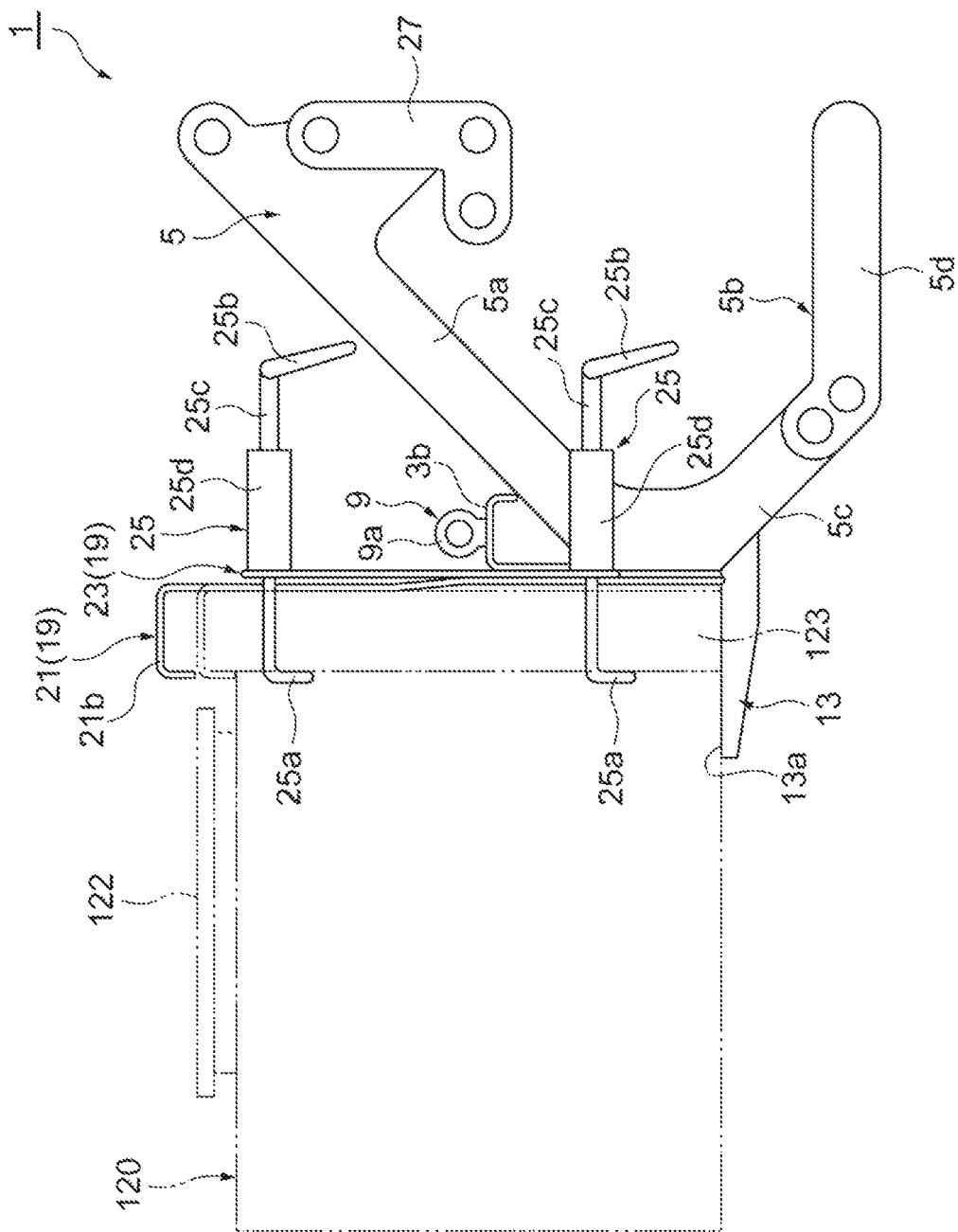
FIG. 6 is a side view of the retrieving device.
Figure 7:
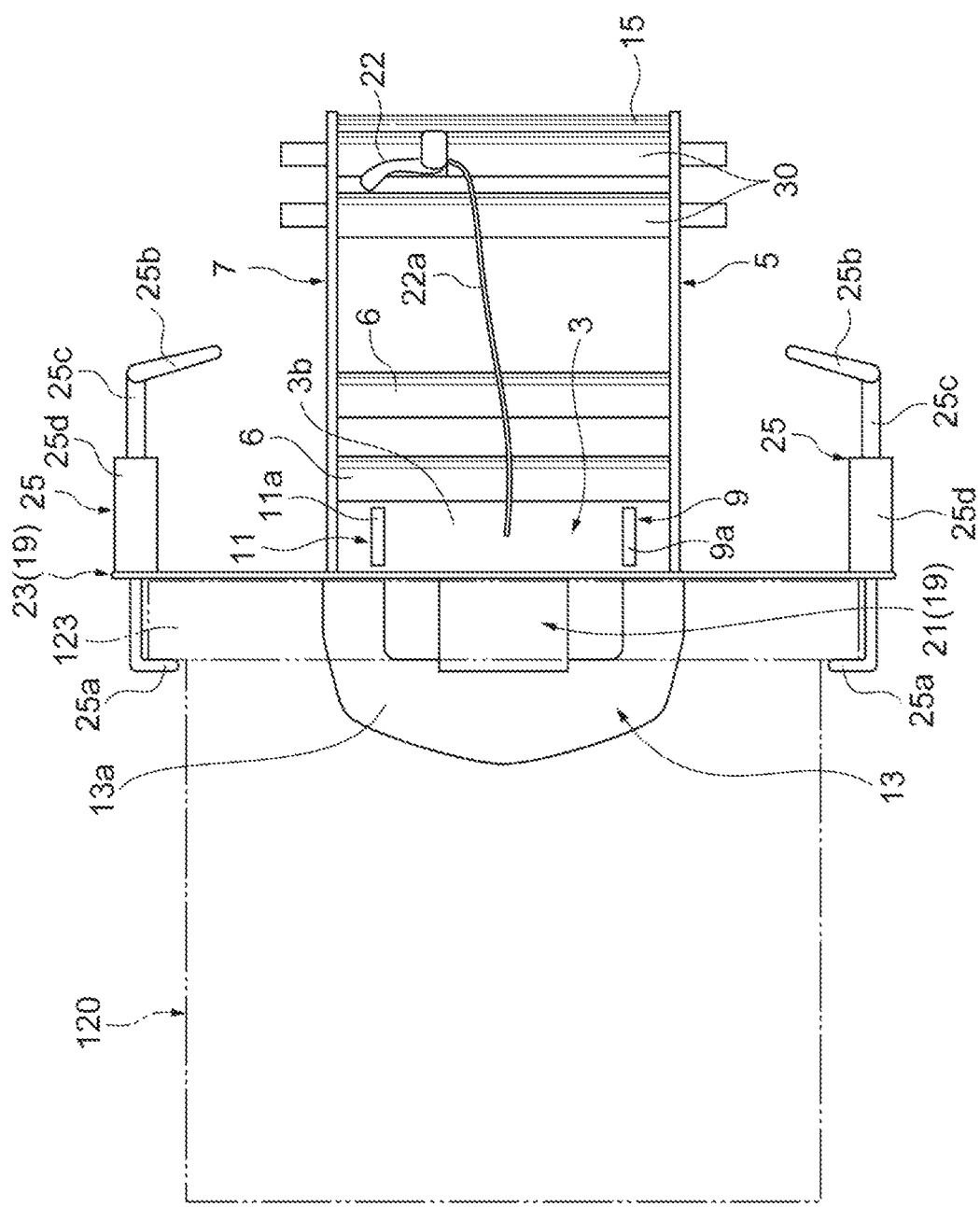
FIG. 7 is a top view of the retrieving device.

The hook portion 21b is formed by bending an upper portion of the body portion 21a forward. In other words, the hook portion 21b is provided above the supporting unit 13. The hook portion 21b has a substantially L-shaped cross-section. As depicted in FIG. 6 and FIG. 8(b), the hook portion 21b is engaged with the front flange 123 on the front side of a FOUP 120. As depicted in FIG. 8(a), when the body portion 21a is moved upward by operation of the lever 22, the hook portion 21b is moved upward in accordance with this movement. When the body portion 21a is moved downward upon release of the operation of the lever 22, the hook portion 21b is engaged with the front flange 123 of the FOUP 120. The dimension between the front end portion of the hook portion 21b and the body portion 21a is set to a dimension that is nearly the same as the thickness of the front flange 123.

The second locking unit 23 restricts movement of the FOUP 120 supported by the supporting unit 13 in the width direction. The second locking unit 23 includes a frame body 24 and locking fixtures 25. The frame body 24 is a plate-like member, having a frame shape. The outer shape of the frame body 24 is substantially rectangular. The frame body 24 is disposed between the main frame 3 and the first locking unit 21. Specifically, a lower end portion of the frame body 24 is fixed to an upper side of the front surface 3a of the main frame 3 such that the longitudinal direction thereof is aligned with the width direction. The width dimension of the frame body 24 is greater than the width dimension of the main frame 3. Specifically, the width dimension of the frame body 24 is greater than the width dimension of the FOUP 120.

The locking fixtures 25 are disposed at respective corner portions of the frame body 24. Each locking fixture 25 includes a hook part 25a, an operating lever 25b, a rod-like coupling part 25c connecting the hook part 25a and the operating lever 25b, and a supporting part 25d supporting the coupling part 25c. The supporting part 25d is a tubular member, and is disposed on the rear surface of the frame body 24. The coupling part 25c has a circular cross-section. The coupling parts 25c are disposed through the respective supporting parts 25d, and are also disposed through holes (not depicted) penetrating the frame body 24 in the thickness direction. Each coupling part 25c is rotatably supported by the corresponding supporting part 25d.

The hook part 25a is provided in a front end portion of the coupling part 25c. The hook part 25a is formed by bending the front end portion of the coupling part 25c in substantially an L-shape. The hook parts 25a are engaged with the front flange 123 of the FOUP 120. The operating lever 25b is provided on a rear end portion of the coupling part 25c.

The locking fixture 25 performs engagement of the hook part 25a, with the front flange 123 and release of the engagement in response to operation of the operating lever 25b. Specifically, in the locking fixture 25, the operating lever 25b is operated from a position where the extending direction of the hook part 25a extends in the height direction as depicted in FIG. 9(a), to a position where the extending direction of the hook part 25a extends in the width direction as depicted in FIG. 9(b), whereby the hook part 25a is engaged with the front flange 123, and accordingly restricts movement of the FOUP 120 in the left-and-right direction. The locking fixture 25 is configured to maintain the state (position) of the hook part 25a at a position where the hook part 25a has been rotated by the operation of the operating lever 25b.

The first attachment unit 27 is provided to the first sub-frame 5. The second attachment unit 28 is provided to the second sub-frame 7. Each of the first attachment unit 27 and the second attachment unit 28 is a plate-like member, and has a substantially L-shape. The first attachment unit 27 and the second attachment unit 28 detachably support a plurality of (e.g., four in the present implementation) weight members 30. Each weight member 30 is formed of metal such as stainless steel, and has a cylindrical shape. The weight member 30 is bridged between the first attachment unit 27 and the second attachment unit 28, to be supported by the first attachment unit 27 and the second attachment unit 28. Specifically, the first attachment unit 27 and the second attachment unit 28 support the weight member 30 with pins inserted thereinto from both end portions of the weight member 30. In the retrieving device 1, the weights on the first handle 15 side and on the second handle 17 side can be adjusted with the weight members 30.

[Method of Retrieving FOUP Using Retrieving Device]

The following describes a method of retrieving a FOUP 120 using the retrieving device 1. The hooks provided to the chains 142 of the chain block 140 depicted in FIG. 2 are attached to the coupling units 9 and 11 of the retrieving device 1. As depicted in FIG. 2, the chain block 140 is attached to a hook (not depicted) provided on a ceiling of the body portion 130. The hook is provided in plurality on the ceiling of the body portion 130 with a predetermined distance spaced from each other. The chain block 140 is attached to a hook disposed in a position closest to a FOUP 120 to be retrieved. The chain block 140 is one of elements constituting the retrieving device 1. The chains 142 may be attached to the coupling units 9 and 11 of the retrieving device 1 in advance. Structures for coupling the coupling units 9 and 11 with the chains 142 may be structures other than the hooks. The chain block 140 may be suspended on a rail installed on the ceiling of the body portion 130.

Subsequently, the retrieving device 1 is positioned in front of a shelf 134 on which the FOUP 120 to be retrieved is accommodated. Subsequently, the supporting unit 13 of the retrieving device 1 is inserted under the FOUP 120, and the supporting surface 13a of the supporting unit 13 is brought into contact with a bottom portion of the FOUP 120. By operating the lever 22, the hook portion 21b of the first locking unit 21 is hooked on the front flange 123 of the FOUP 120, and the front flange 123 is locked by the hook portion 21b. Furthermore, by operating the operating levers 25b of the locking fixtures 25, the front flange 123 is locked by the hook parts 25a.

Subsequently, by operating the chain block 140, the retrieving device 1 is pulled upward. At this time, the retrieving device 1 is lifted by the chain block 140 such that the FOUP 120 is lifted to a position higher than the upper end surfaces of the positioning pins 134c provided to the placement unit 134a. In this state, the first handle 15 and/or the second handle 17 is operated to move the retrieving device 1 toward the operator, and the FOUP 120 is retrieved from the shelf 134. As described above, the FOUP 120 is retrieved by the retrieving device 1.

As described in the foregoing, the retrieving device 1 according to the present implementation includes the supporting unit 13 configured to support a front portion of a load from the front side of the FOUP 120. Thus, even if the clearance between the FOUP and the corresponding shelf 134 is small, the front portion of the FOUP 120 is supported, whereby the FOUP 120 can be supported without working in this small clearance. The supporting unit 13 can be moved in the up-and-down direction by the chain block 140 coupled to the coupling units 9 and 11 via the chains 142. Thus, the supporting unit 13 is moved upward by the chain block 140 with the FOUP 120 being supported by the supporting unit 13, whereby the FOUP 120 can be lifted from the shelf 134. This enables the retrieving device 1 to easily retrieve the FOUP 120 from the shelf 134, which improves workability.

When the FOUP 120 is retrieved from the shelf 134, the supporting unit 13 is suspended by the chain block 140 via the coupling units 9 and 11. At this time, the retrieving device 1 tilts toward the FOUP 120 due to the weight of the FOUP 120. To prevent this, in the retrieving device 1, the first handle 15 and the second handle 17 are provided on the side opposite to the supporting unit 13 with the coupling units 9 and 11 interposed therebetween. With this configuration, force acting against the tilting of the supporting unit 13 due to the weight of the FOUP 120 can be easily applied by the first handle 15 and the second handle 17, which allows the retrieving device 1 to be easily balanced. This enables the retrieving device 1 to be stably operated, which improves workability.

In the present implementation, the supporting unit 13 supports a bottom surface of the FOUP 120. This enables the FOUP 120 to be stably supported. The retrieving device 1 includes the first locking unit 21 and the second locking unit 23. This enables the FOUP 120 supported by the supporting unit 13 to be prevented from being displaced. Thus, the FOUP 120 can be stably retrieved.

In the present implementation, the first locking unit 21 has the hook portion 21b positioned above the supporting unit 13, and restricts movement of the FOUP 120 in the up-and-down direction. With this configuration, the FOUP 120 the bottom surface of which is supported by the supporting unit 13 can be prevented from tilting rearward. Thus, the FOUP 120 can be stably retrieved.

In the present implementation, the retrieving device 1 includes the first attachment unit 27 and the second attachment unit 28 provided on a side of the first handle 15 and the second handle and configured to detachably support the weight members 30. With this configuration, by attaching the weight members 30 to the first attachment unit 27 and the second attachment unit 28 in accordance with the weight of the FOUP 120, balance can be adjusted based on the weight of the FOUP 120. This enables the FOUP 120 to be more stably retrieved.

In the present implementation, the retrieving device 1 includes the first handle 15 positioned above the supporting unit 13 and the second handle 17 positioned below the supporting unit 13. With this configuration, the first handle 15 and the second handle 17 at two locations can be gripped and operated, and thus the FOUP 120 can be more stably retrieved.

In the present implementation, the first handle 15 and the second handle 17 extend along the left-and-right direction. With this configuration, force acting against the tilting of the supporting unit 13 due to the weight of the FOUP 120 can be more easily applied by the first handle 15 and the second handle 17.

The example implementation(s) is not limited to the present implementation. For example, in the implementation above, a configuration has been described as one example in which the FOUP 120 is supported from below by the supporting unit 13. However, the configuration of the supporting unit is not limited to this. For example, the supporting unit may be configured to support the FOUP 120 by clamping the front flange 123 of the FOUP 120.

In the implementation above, a configuration has been described as one example in which the respective units of the retrieving device 1 are formed of metal such as stainless steel. However, the material forming the respective units is not limited to this. The material forming the respective units may be any material that can provide sufficient rigidity.

In the implementation above, a configuration has been described as one example in which the supporting unit 13 supports the bottom surface of the FOUP 120. However, the supporting unit only needs to be configured to support a front portion of the FOUP 120 from the front side of the FOUP 120. For example, the supporting unit may be configured to support the FOUP 120 by clamping the front flange 123 of the FOUP 120.

In the implementation above, a configuration has been described as one example in which the first handle 15 and the second handle 17 extend along the left-and-right direction. However, the configuration of the first handle 15 and the second handle 17 is not limited to this. Only either one of the first handle 15 and the second handle 17 may be provided. The first handle and the second handle may extend along the height direction. The positions of the handles only need to be set appropriately depending on the design.

In the implementation above, a configuration has been described as one example in which the locking unit 19 includes the first locking unit 21 and the second locking unit 23. However, only either one of the first locking unit 21 and the second locking unit 23 may be provided. If the first locking unit 21 is not provided, the supporting unit 13 is preferably configured to support a front portion and a rear portion of the FOUP 120. By this configuration, a situation in which the FOUP 120 tilts rearward, for example, can be prevented, and thus the FOUP 120 can be stably supported.

In the implementation above, a configuration has been described as one example in which a pair of coupling units that are the coupling unit 9 and the coupling unit 11 are provided. However, the number of the coupling units to be provided only needs to be one or more.

In the implementation above, a configuration has been described as one example in which the body portion 21a of the first locking unit 21 is moved in the up-and-down direction by operation of the lever 22. However, the structure for moving the body portion 21a is not limited to the lever 22.

In the implementation above, a configuration has been described as one example in which the body portion 21a of the first locking unit 21 is moved in the up-and-down direction to perform engagement of the hook portion 21b with the front flange 123 and release of the engagement, whereby movement of the FOUP 120 in the up-and-down direction is restricted. However, restriction of the movement of the FOUP 120 in the up-and-down direction may be performed by other structures. Similarly, restriction of movement of the FOUP 120 in the left-and-right direction may be performed by other structures, not limited to being performed by the second locking unit 23.

In the implementation above, a configuration has been described as one example in which the retrieving device 1 is included by the stocker 104. However, the retrieving device 1 may be installed in the stocker 104 on an as-needed basis.

In the implementation above, a FOUP that is one type of semiconductor conveyance cassette has been exemplified and described as one example of a load. However, the load is not limited to the FOUP. For example, the load may be a front-opening shipping box (FOSB), a multi-application carrier (MAC), or a wafer frame cassette. The retrieving device 1 can be used to retrieve these types of semiconductor conveyance cassettes.

REFERENCE SIGNS LIST

1 . . . retrieving device, 9, 11 . . . coupling unit, 13 . . . supporting unit, 15 . . . first handle (first gripping unit), 17 . . . second handle (second gripping unit), 19 . . . locking unit, 21 . . . first locking unit, 23 . . . second locking unit, 27 . . . first attachment unit, 28 . . . second attachment unit, 30 . . . weight member, 104 . . . stocker (storing device), 120 . . . FOUP (load), 130 . . . body portion (housing), 134 . . . shelf, 136 . . . automatic conveying device (transfer device)

The invention claimed is:

1. A retrieving device, provided in a storing device including a plurality of shelves on which or from which a load is loaded or unloaded through an opening on each of the plurality of shelves that is open forward, and on which the load is supported, the plurality of shelves being provided at multiple levels in an up-and-down direction, and is configured to retrieve the load from one of the plurality of shelves through the opening, the retrieving device comprising:
- a supporting unit configured to support a front portion of the load from a front side of the load;
- a coupling unit configured to be coupled, via a coupling member, to a moving device that is capable of moving the supporting unit in the up-and-down direction; and
- a gripping unit provided on a side opposite to the supporting unit, with the coupling unit interposed therebetween,
- wherein the gripping unit is provided on one face of the coupling unit, and the supporting unit is provided on another face of the coupling unit opposite to the gripping unit,
- wherein the moving device is provided at a position on a ceiling of the storing device and in front of and distanced from the plurality of shelves, and
- the retrieving device is suspended from the coupling unit of the moving device and moves in the up-and-down direction by the moving device.

2. The retrieving device according to claim 1, wherein the supporting unit includes a first supporting unit configured to support a bottom surface of the load, and a second supporting unit configured to restrict movement of the load supported by the first supporting unit.

3. The retrieving device according to claim 2, wherein the second supporting unit is provided above the first supporting unit to restrict movement of the load in the up-and-down direction.

4. The retrieving device according to claim 1, wherein the retrieving device includes an attachment unit provided on a side of the gripping unit, and configured to detachably support a weight member.

5. The retrieving device according to claim 1, wherein the gripping unit includes a first gripping unit disposed above the supporting unit and a second gripping unit disposed below the supporting unit.

6. A storing device comprising:
- a housing;
- a plurality of shelves that are provided in the housing and on each of which or from each of which a load is loaded or unloaded through an opening that is open forward, and on which the load is supported, the plurality of shelves being provided at multiple levels in an up-and-down direction;
- a port where loading and unloading are performed;
- a transfer device configured to transfer the load between the port and the shelves; and
- a retrieving device configured to retrieve the load forward from the shelves through the opening, wherein
- the retrieving device includes:
  - a supporting unit configured to support a front portion of the load from a front side of the load;
  - a coupling unit configured to be coupled, via a coupling member, to a moving device being capable of moving the supporting unit in the up-and-down direction; and
  - a gripping unit provided on a side opposite to the supporting unit with the coupling unit interposed therebetween,
  - wherein the gripping unit is provided on one face of the coupling unit, and the supporting unit is provided on another face of the coupling unit opposite to the gripping unit,
  - wherein the moving device is provided at a position on a ceiling of the storing device and in front of and distanced from the plurality of shelves, and
  - the retrieving device is suspended from the coupling unit of the moving device and moves in the up-and-down direction by the moving device.

* * * * *